United States Patent
Chikawa (10) Patent No.: US 6,911,729 B1
(45) Date of Patent: Jun. 28, 2005

(54) TAPE CARRIER SEMICONDUCTOR DEVICE

(75) Inventor: Yasunori Chikawa, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/540,529

(22) Filed: Mar. 31, 2000

(30) Foreign Application Priority Data

May 14, 1999 (JP) .......................................... 11-134529

(51) Int. Cl.$^7$ ............................. H01L 23/34; H05K 1/03
(52) U.S. Cl. ..................... 257/724; 257/773; 174/255
(58) Field of Search ................................ 257/773, 668, 257/673, 669, 735, 786, 680, 678, 734, 723, 724, 730; 174/250, 255, 260; 361/748, 749; 438/106, 110, 118, 119

(56) References Cited

U.S. PATENT DOCUMENTS

| | | | |
|---|---|---|---|
| 4,551,912 A | | 11/1985 | Marks et al. |
| 4,811,081 A | * | 3/1989 | Lyden .......................... 257/668 |
| 4,851,964 A | | 7/1989 | Endo |
| 4,977,441 A | * | 12/1990 | Ohtani et al. .................. 257/48 |
| 5,032,542 A | | 7/1991 | Kazami et al. |
| 5,075,252 A | | 12/1991 | Schendelman |
| 5,153,707 A | | 10/1992 | Makino et al. |
| 5,232,532 A | * | 8/1993 | Hori ............................. 156/163 |
| 5,427,641 A | * | 6/1995 | Muramatsu et al. ........ 156/252 |
| 5,726,491 A | * | 3/1998 | Tajima et al. ................ 257/668 |
| 5,949,134 A | * | 9/1999 | Yanagisawa ................. 257/668 |
| 6,100,112 A | * | 8/2000 | Amano et al. ............... 438/106 |
| 6,274,405 B1 | * | 8/2001 | Hashimoto ................... 438/110 |
| 6,313,526 B1 | * | 11/2001 | Nakamura ................... 257/706 |
| 6,315,156 B1 | * | 11/2001 | Mahoney et al. ............. 221/72 |
| 6,388,888 B1 | * | 5/2002 | Seko et al. ................... 361/767 |
| 6,559,524 B2 | * | 5/2003 | Seko ............................ 257/673 |

FOREIGN PATENT DOCUMENTS

| | | |
|---|---|---|
| DE | 196 01 388 A1 | 7/1997 |
| EP | 1052695 | * 11/2000 |
| JP | 64-073628 | 3/1989 |
| JP | 03-215953 | 9/1991 |
| JP | 6-53273 | 2/1994 |
| JP | 06-053273 | 2/1994 |
| JP | 07-007043 | 1/1995 |
| JP | 07-161765 | 6/1995 |
| JP | 86114535 | 5/1999 |
| JP | 82852/1994 | 11/1999 |
| JP | 2001 176918 | * 6/2001 |
| WO | 91/18416 | 11/1991 |

OTHER PUBLICATIONS

Patent No. 358231, "A Semiconductor Device and Manufacturing Method Thereof, A Circuit Substrate, and a Film Carrier Tape", published May 11, 1999.
Japanese Office Action dated Feb. 10, 2004 in Japanese Patent Appln. No. 11–134529 (including English translation).
Stijns, "Chip–on–Foil—The Flexible Approach to LCD Modules", Electronic Components and Applications, Philips. Eindhoven, NL, vol. 9, No. 4, 1989, pp. 225–239.
Second Office Action (including English translation) for Patent Application No. 089105999 (Mar. 24, 2003).

* cited by examiner

*Primary Examiner*—Alonzo Chambliss
(74) *Attorney, Agent, or Firm*—Nixon & Vanderhye PC (57) ABSTRACT

In a COF manufactured by bonding and mounting a semiconductor element onto a wiring pattern on a lengthy tape carrier, the wiring patterns are aligned in more than one direction with respect to a direction in which the tape carrier is fed. The wiring patterns have a layout that increases a utilized area of the tape carrier (in other words, such that reduces useless areas). Consequently, the number of the tape carrier semiconductor devices manufactured out of a tape carrier of a certain length can be increased thereby saving manufacturing costs.

11 Claims, 9 Drawing Sheets

TAPE CARRIER SEMICONDUCTOR DEVICE

FIELD OF THE INVENTION

The present invention relates to a tape carrier semiconductor device composed of a flexible printed board and a semiconductor element bonded and mounted thereon, and a method of manufacturing the same.

BACKGROUND OF THE INVENTION

In packing semiconductor elements into an electronic circuit, a TAB (Tape Automated Bonding) technique has been known, by which a tape carrier semiconductor device is obtained by bonding and mounting a semiconductor element on a flexible printed board (so called tape carrier)

Tape carrier semiconductor devices obtained by the TAB technique include a COF (Chip On FPC (Flexible Printed Circuit)), a TCP (Tape Carrier Package), etc. In the COF, the tape carrier is bonded to the semiconductor element electrode and a wiring pattern on the bonded portion is backed with a tape carrier material. On the other hand, in the TCP the tape carrier material is bonded to the semiconductor element electrode and a through-hole is provided in the bonded portion where the semiconductor element is mounted. Further, a top end of a wiring pattern called an inner lead which protrudes to form a cantilever is bonded to the semiconductor element electrode.

The tape carrier semiconductor devices are mainly used as a liquid crystal driver, a thermal head printer, etc.

The tape carrier semiconductor device is completed in the following manner. That is, identical wiring patterns are formed successively on a lengthy tape (tape carrier material) at regular intervals in a single direction with respect to a direction in which the tape is fed, and semiconductor elements are mounted at specific positions of the wiring patterns. Then, the tape carrier semiconductor device is completed when punched out individually from the lengthy tape. Thus, the tape carrier semiconductor devices formed on the tape carrier are designed along a single direction with respect to a direction in which the tape is fed. In case that the tape carrier semiconductor device thus completed is used for a liquid crystal panel, for example, it is connected to the liquid crystal panel at one side end, and to the printed board or the like at the other side end.

Because the tape carrier semiconductor device is flexible, it is designed on the provision that it will be bent when mounted, and therefore, given with high design flexibility. Thus, in the case where a layout of the tape carrier semiconductor devices are designed on a lengthy tape carrier and each tape carrier semiconductor device is not necessarily a rectangle, which is the area shape in which the tape carrier is utilized efficiently, but can be of an L-shape, a T-shape, a triangular shape, etc.

However, when the tape carrier semiconductor devices of arbitrary shapes are aligned in a single direction, as has been discussed, a useless area which is not used in manufacturing the tape carrier semiconductor devices is formed on the tape carrier. For example, in the case where COFs 51 of a shape shown in FIG. 11(a) are aligned on the tape carrier, then a conventional layout is as the one shown in FIG. 11(b). That is, in this case, a useless area (indicated by diagonal lines) 52 is formed on the tape carrier.

When the manufacturing procedure and used materials of the tape carrier are concerned, the tape carrier is manufactured in the form of a lengthy tape from reel to reel, and therefore, the cost thereof increases in proportion to the tape area. Thus, even if some areas of the tape carrier are not used in manufacturing the tape carrier semiconductor devices, the cost wasted on such areas is included in the manufacturing cost. Therefore, the manufacturing cost of the tape carrier semiconductor devices increases as the areas which are not used in manufacturing increases. The useless areas may be reduced by designing the tape carrier semiconductor devices in a shape with which the tape carrier is utilized efficiently (for example, rectangles). However, this is not preferable, because the design flexibility given to the tape carrier semiconductor devices as benefits will be lost.

Japanese Laid-open Utility Model No. 82852/1994 (Japanese Official Gazette *Jitsukaihei* No. 6-82852, publishing date: Nov. 25, 1994) discloses a technique for aligning the semiconductor device TABs in more than one row in the width direction of the tape carrier as a method of minimizing unused areas on the tape carrier and conducting an electrical test on more than one TAB simultaneously. However, the above publication does not solve the problem that useless areas are readily formed on the tape area if the tape carrier semiconductor devices are of arbitrary shapes, because each TAB is aligned in one specific direction with respect to a direction in which the tape is fed, and each TAB is of a rectangular shape with which the tape area can be utilized efficiently.

SUMMARY OF THE INVENTION

It is therefore an object of the present invention to save the manufacturing cost of the tape carrier semiconductor devices by increasing the number of devices manufactured out of a tape carrier of a certain length without losing the benefits that they can be designed in arbitrary shapes.

In order to fulfill the above and other objects, a tape carrier of the present invention is a tape carrier used for a tape carrier semiconductor device comprising a lengthy tape carrier and a semiconductor element bonded and mounted thereon, on which wiring patterns of the tape carrier semiconductor device are successively formed, in which:

wiring patterns of an identical shape are aligned in more than one direction with respect to a direction in which the tape carrier is fed in a layout which increases the utilized area of the tape carrier.

Also, a tape carrier semiconductor device of the present invention is manufactured by:

bonding and mounting a semiconductor element on a specific position of each wiring pattern on a tape carrier, on which wiring patterns of an identical shape are aligned in more than one direction with respect to a direction in which the tape carrier is fed, in a layout that increases a utilized area of the tape carrier; and punching out tape carrier semiconductor devices, each having the wiring pattern and the semiconductor element bonded and mounted thereon, from the tape carrier.

Also, a manufacturing method of a tape carrier semiconductor device of the present invention includes:

a first step of bonding and mounting a semiconductor element on a specific position of each wiring pattern on a tape carrier, on which wiring patterns of an identical shape are aligned in more than one direction with respect to a direction in which the tape carrier is fed, in a layout that increases a utilized area of the tape carrier; and a second step of punching out tape carrier semiconductor devices, each having the wiring pattern and the semiconductor element bonded and mounted thereon, from the tape carrier, so that individual tape carrier type semiconductor devices are manufactured.

According to the above tape carrier, tape carrier semiconductor device, and manufacturing method of the tape carrier semiconductor device, by aligning the wiring patterns of devices having identical shapes in more than one direction with respect to a direction in which the tape carrier is fed, a layout that increases the utilized area of the tape carrier can be realized. Useless areas which have no contribution in forming the tape carrier semiconductor devices on the tape carrier can be reduced compared with a conventional arrangement in which all the wiring patterns are formed and aligned on the tape carrier along the same direction.

Consequently, from a tape carrier of a specific length, more tape carrier semiconductor devices can be manufactured compared with the conventional method, thereby making it possible to significantly save on manufacturing costs associated with the tape carrier semiconductor devices.

Further, in order to fulfill the above and other objects, a tape carrier of the present invention is a tape carrier used for a tape carrier semiconductor device comprising a lengthy tape carrier and a semiconductor element bonded and mounted thereon, on which wiring patterns of the tape carrier semiconductor device are successively formed, in which:

wiring patterns of more than one kind each having a different shape are aligned in a layout that increases a utilized area of the tape carrier.

Also, a tape carrier semiconductor device of the present invention is manufactured by:

bonding and mounting a semiconductor element on a specific position of each wiring pattern on a tape carrier, on which wiring patterns of more than one kind each having a different shape are aligned, in a layout that increases a utilized area of the tape carrier; and punching out tape carrier semiconductor devices, each having the wiring pattern and the semiconductor element bonded and mounted thereon, from the tape carrier.

In order to fulfill the above and other objects, a method of manufacturing a tape carrier semiconductor device of the present invention includes:

a first step of bonding and mounting a semiconductor element on a specific position of each wiring pattern on a tape carrier, on which wiring patterns of more than one kind each having a different shape are aligned, in a layout that increases a utilized area of the tape carrier; and a second step of punching out tape carrier semiconductor devices, each having the wiring pattern and the semiconductor element bonded and mounted thereon, from the tape carrier, so that individual tape carrier semiconductor devices are manufactured.

According to the above tape carrier, tape carrier semiconductor device, and manufacturing method of the tape carrier semiconductor device, in the case where wiring patterns of more than one kind exist, each having a different shape, and are aligned on the same tape carrier, these wiring patterns of more than one kind can be aligned in a layout that increases a utilized area of the tape carrier by making an optimal combination. Thus, useless areas which have no contribution in forming the tape carrier semiconductor devices on the tape carrier can be reduced compared with the conventional arrangement in which the wiring patterns of the same kind are aligned along the same direction.

Consequently, from the tape carrier of a specific length, more tape carrier semiconductor devices can be manufactured compared with the conventional method, thereby making it possible to significantly save on manufacturing costs associated with the tape carrier semiconductor devices.

Further, in case where tape carrier semiconductor devices of more than one kind are manufactured, these tape carrier semiconductor devices can be manufactured simultaneously on a single kind of tape carrier. Thus, the arrangements of the present invention are suitable in manufacturing devices of many kinds with a small number of each.

Here, the wiring patterns of more than one kind each having a different shape include mirror symmetrical wiring patterns.

For a fuller understanding of the nature and advantages of the invention, reference should be made to the ensuing detailed description taken in conjunction with the accompanying drawings.

BRIEF DESCRIPTION OF THE DRAWINGS

FIGS. 1(a) and 1(b) are views depicting an arrangement in accordance with Embodiment 1 of the present invention.

FIGS. 7(a) through 7(c) are views depicting an arrangement in accordance with Embodiment 2 of the present invention.

FIGS. 11(a) and 11(b) are views depicting a conventional arrangement.

DESCRIPTION OF THE EMBODIMENTS

The following description will describe embodiments of the present invention. The tape carrier semiconductor devices of the present invention include COFs, TCPs, etc., and because substantially the same functional effect can be attained whether the present invention is applied to the COFs or TCPs, the kinds of the tape carrier semiconductor devices of the present invention are not especially limited. It should be appreciated, however, that because the COFs are not shaped in rectangles in many cases in comparison with the TCPs, the present invention can be more appreciated with the COFs. Thus, in the following explanation, the COFs are used as examples of the tape carrier semiconductor devices. The COFs are not precisely defined, and those mounted on the tape and those punched out individually from the tape are both referred to as the COFs.

(Embodiment 1)

Figure 1:
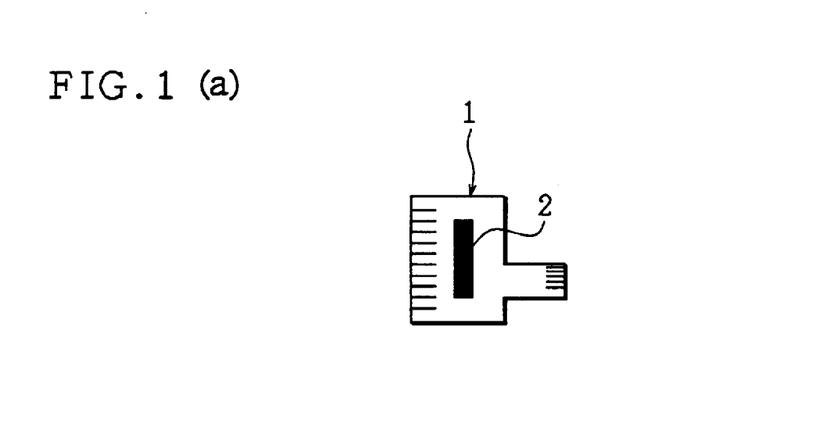
FIG. 1(a) is a plan view showing the shape of a COF to be manufactured.
FIG. 1(b) is a plan view showing the pattern layout of the COFs on a lengthy tape carrier.

FIGS. 1(a) and 1(b) show the shape of the COF of the present embodiment and the layout of the COF patterns on the tape carrier, respectively.

Figure 11:
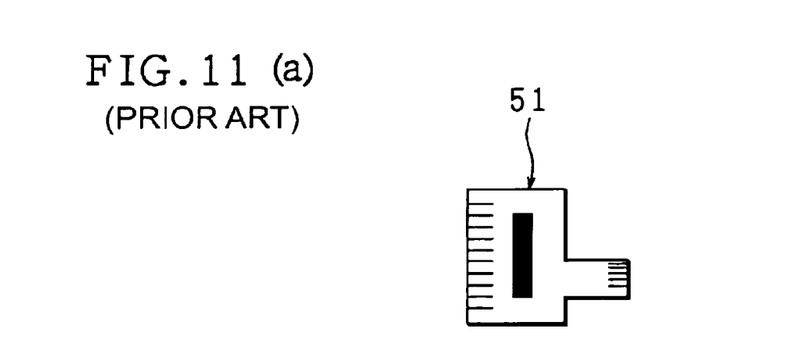
FIG. 11(a) is a plan view showing the shape of a COF to be manufactured.
FIG. 11(b) is a plan view showing a conventional pattern layout of the COFs on a lengthy tape carrier.

A COF 1 is of the shape shown in FIG. 1(a), which is identical with the shape of the COF 51 shown in FIG. 11 (a). The COF 1 is composed of a flexible printed board on which a wiring pattern has been formed, and a semiconductor element (indicated by black-paint) 2 bonded and mounted thereon. The wiring pattern is generally composed of an inner lead connected to the electrode of the semiconductor element 2 and an outer lead connected to an external circuit. In FIG. 1(a), the inner lead is omitted for ease of explanation.

In case that the COFs 1 are designed in a layout so as to be aligned on the tape carrier in accordance with the method of the present embodiment, adjacent COF patterns 1a and 1b are positioned on the tape carrier in such a manner that one is turned by 180 degrees with respect to the other. When punched out from the tape carrier, the COFs 1 of the identical shape can be obtained from the COF patterns 1a and 1b.

According to the present embodiment, by aligning the COFs 1 of the same shape on the tape carrier in different directions, more COFs can be mounted on the tape carrier along its lengthwise direction in comparison with the conventional arrangement by which the COFs are mounted in a single direction, thereby utilizing the tape area more efficiently. This will be discussed more in detail with reference to a comparison between FIGS. 1(b) and 11(b).

According to the conventional arrangement shown in FIG. 11(b), a useless area 52 is formed as all the COFs 51 are aligned in a single direction, and three COFs 51 are manufactured out of the tape carrier of a specific length L. On the other hand, according to the arrangement of the present embodiment shown in FIG. 1(b), a useless area 3 is formed as well, but it is quite small compared with the useless area 52, and four COFs 1 are manufactured out of the tape carrier of the same length L. In other words, out of the tape carrier of the length L, four COFs are manufactured in the present embodiment whereas three COFs are manufactured in the conventional arrangement. This means, if the same number of COFs are to be manufactured, the tape carrier can be saved by 25% in length in the present embodiment in comparison with the conventional arrangement. Thus, the arrangement of the present embodiment can provide significant manufacturing cost savings of the COFs.

Figure 2:
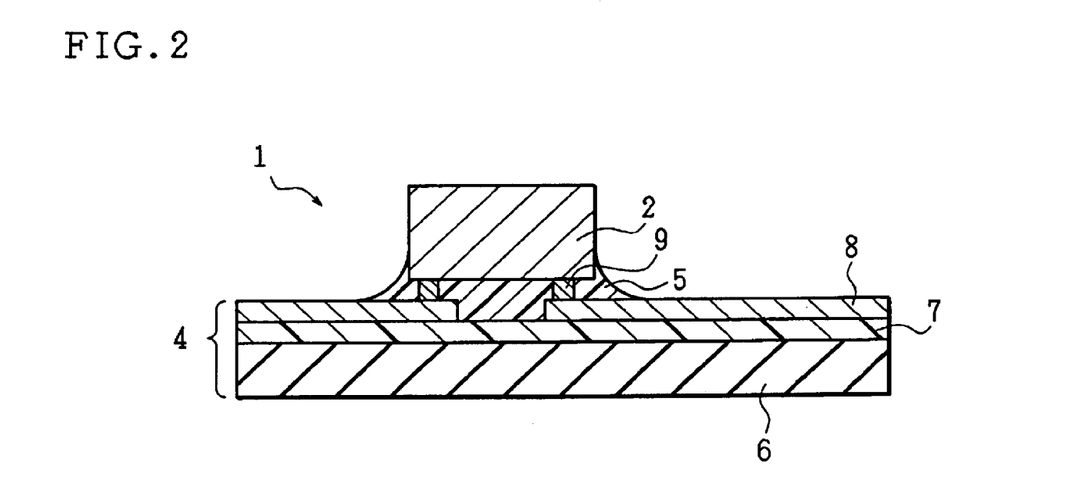
FIG. 2 is a cross section showing an arrangement of the COF when a triple-layer tape carrier is used.

Next, FIG. 2 shows a cross section of the COF 1. In case that a triple-layer tape is used as the tape carrier, the semiconductor element 2 is bonded onto the tape carrier 4 at a specific position, and a space formed between the tape carrier 4 and semiconductor element 2 is filled with sealing resin 5.

The tape carrier 4 is composed of an insulating material (tape carrier material) 6 made of polyimide, and a copper foil pattern (wiring pattern) 8 layered thereon through a bonding agent 7 having a thickness of 5–15 $\mu$m. The thickness of the insulating material 6 is 75 $\mu$m (typical thickness of an ordinary TCP), 40 $\mu$m, or 25 $\mu$m. The thickness of 40 $\mu$m or 25 $\mu$m is preferable to fully exploit the flexibility benefits of the COF. Also, a protruding electrode (generally referred to as a bump) 9 is formed at an external outlet electrode of the semiconductor element 2. Tinning or gilding is applied to the copper foil pattern 8 and protruding electrode 9 when necessary, and in the present embodiment, tinning is applied to the copper foil pattern 8 and gilding is applied to the protruding electrode 9.

When the semiconductor element 2 is bonded to the tape carrier 4, the semiconductor element 2 and tape carrier 4 are positioned in such a manner that the electrode forming surface of the former opposes the pattern surface of the latter, and heat and pressure are applied for a predetermined time from either the back surface of the electrode forming surface of the semiconductor element 2 or the back surface of the pattern surface of the tape carrier 4, whereby the protruding electrode 9 of the semiconductor element 2 is connected to the copper foil pattern 8 of the tape carrier 4. In other words, in the present embodiment, the copper foil pattern 8 is tinned and the protruding electrode 9 is gilt, and the plating materials form an alloy as heat and pressure are applied. Consequently, the protruding electrode 9 is connected to the copper foil pattern 8 by a Au—Sn alloy.

After the protruding electrode 9 is connected to the copper foil pattern 8, a space formed between the tape carrier 4 and semiconductor element 2 is filled with the sealing resin 5. The sealing resin 5 is filled in the space to enhance moisture resistance and mechanical strength. In addition, an insulating material called solder resist is applied entirely, except for an external connection terminal (that is, outer lead) of the tape carrier 4, to prevent short-circuit caused when a conductive foreign substance is placed directly on the pattern.

Figure 3:
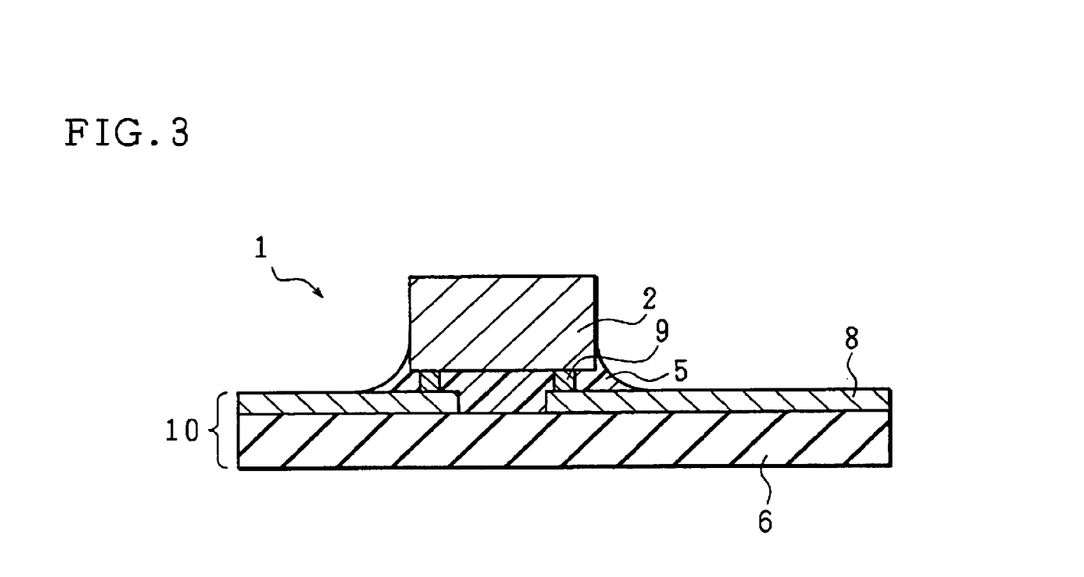
FIG. 3 is a cross section showing an arrangement of the COF when a double-layer tape carrier is used.

The COF shown in FIG. 2 is composed of a triple-layer tape carrier 4; however, a COF composed of a double-layer tape carrier 10, as shown in FIG. 3, may be used as well. The tape carrier 10 does not require the bonding agent 7 and the copper foil pattern 8 is directly formed on the insulating material 6.

Figure 4:
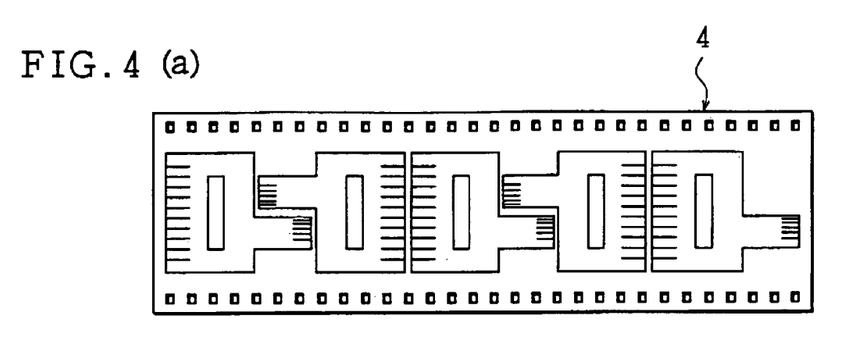
FIGS. 4(a) through 4(c) are views detailing a manufacturing procedure of the COF.

Next, the following will describe the manufacturing procedure of the COF of the present embodiment with reference to FIGS. 4(a) through 4(c).

Initially, the tape carrier 4 is manufactured in the manufacturing procedure of the tape carrier shown in FIG. 4(a). When the pattern is designed, the layout on the tape carrier 4 must be designed in such a manner that the useless areas 3 (see FIG. 1(b)) are minimized, that is, as many COFs 1 as possible are manufactured out of the tape carrier 4 of a specific length. It should be appreciated, however, that the tape carrier is manufactured in the conventional manner and no additional steps are required.

Then, in the ILB (Inner Lead Bonding) step shown in FIG. 4(b), the semiconductor element 2 is bonded to a specific position of the wiring pattern formed in the manufacturing procedure of the tape carrier 4. Here, the semiconductor element 2 is picked up from the semiconductor wafer and aligned to a specific position on the tape carrier 4, and heat and pressure are applied by a device called an inner lead bonder, whereby the semiconductor element 2 is bonded to the tape carrier 4. In the ILB step, the wiring patterns are formed on the tape carrier 4 in different directions with respect to the direction in which the tape is fed. Accordingly, the alignment position of each semiconductor element 2 should be matched with the alignment direction of their respective wiring patterns, but only a mechanism that can rotate the picked-up semiconductor element 2 at arbitrary angles has to be provided and no further equipment is required. The ILB step discussed above corresponds to a first step set forth in the claims below.

The ILB step is followed by a resin applying step and an electrical testing step, and in the following punching step shown in FIG. 4(C), the COFs 1 formed successively on the tape carrier 4 are punched out individually. This punching step is conducted by using a punching mold. In the punching step, the direction along which each COF 1 is punched out also has to be matched with the alignment direction of their respective wiring patterns, but here again only a mechanism that can rotate the punching mold at arbitrary angles has to be provided. Here, the punching step corresponds to a second step set forth in the claims below.

The COF 1 thus completed constitutes an a module structure when the external connection terminal (outlead) is connected to another circuit board in an OLB (Outer Lead Bonding) step. For example, in the case where the COF 1 is used as a driver of a liquid crystal display, the COF 1 is connected to the liquid crystal panel and the like, thereby forming a liquid crystal module. Also, chip components including a resistor, a capacitor, an LED (Liquid Crystal Display), etc. can be mounted on the tape carrier 4. Consequently, the tape carrier 4 can form a module structure which also serves as a circuit board, thereby utilizing space in the module more efficiently.

In the manufacturing method of the COF shown in FIGS. 4(a) through 4(c), in the IBL step and punching step, a method of rotating the pick-up mechanism of the semiconductor element 2 and punching mold was explained as a means to match the alignment direction of the semiconductor elements 2 and the punching-out direction of the COFs 1 with the direction of the wiring pattern. The following will explain another manufacturing method of the COFs with reference to FIGS. 5(a) through 5(c) and FIGS. 6(a) and 6(b).

Figure 5:
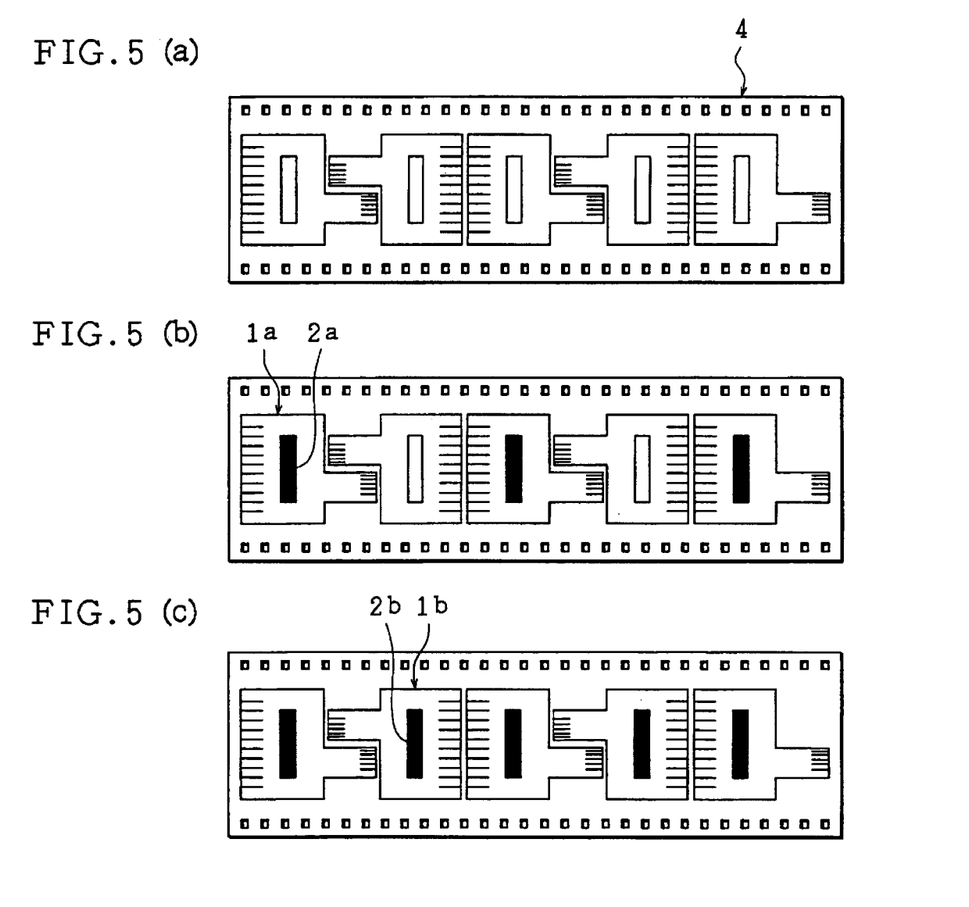
FIGS. 5(a) through 5(c) are views explaining a part of another manufacturing procedure of the COF.

The tape carrier manufacturing step in FIG. 5(a) is identical with the step in FIG. 4(a).

In the ILB step shown in FIGS. 5(b) and 5(c), more than one kind of semiconductor elements are mounted sequentially on the same tape carrier 4 by using more than one pick-up mechanism when picking up the semiconductor elements 2 from the semiconductor wafer and positioning the same to the specific positions on the tape carrier 4. In the present embodiment, two kinds of COFs 1a and 1b having opposite alignment directions are formed on the tape carrier 4, and accordingly, two pickup mechanisms are provided. When punched out, the COFs 1a and 1b form identical COFs, but at this point the COFs having different alignment directions on the tape carrier are deemed as different kinds.

As shown in FIG. 5(b), the semiconductor element 2a is mounted on the wiring pattern which will become the COF 1a by one pick-up mechanism, and as shown in FIG. 5(c), the semiconductor element 2b is mounted on the wiring pattern which will become the COF 1b by the other pick-up mechanism. As was in the step of FIG. 4(b), the semiconductor elements 2a and 2b mounted on the tape carrier 4 are bonded to the same by means of heating and pressurization by the inner lead bonder. The positional relation between the adjacent COFs 1a and 1b is constant in the layout on the tape carrier 4. That is, when the COFs 1a (COFs 1b) alone are concerned, the alignment direction and intervals on the tape carrier 4 are constant. Hence, it is by no means difficult to mount the semiconductor element 2a onto each COF 1a by using one pick-up mechanism.

Further, the ILB step may be conducted with the conventional facility. To be more specific, more than one kind of semiconductor elements are mounted on the same tape carrier 4 by feeding the tape carrier 4 more than once into a bonding device composed of the pick-up mechanism and inner lead bonder. In case of the present embodiment, the step of FIG. 5(b) is conducted in the first feeding, and the step of FIG. 5(c) is conducted in the second feeding.

Figure 6:
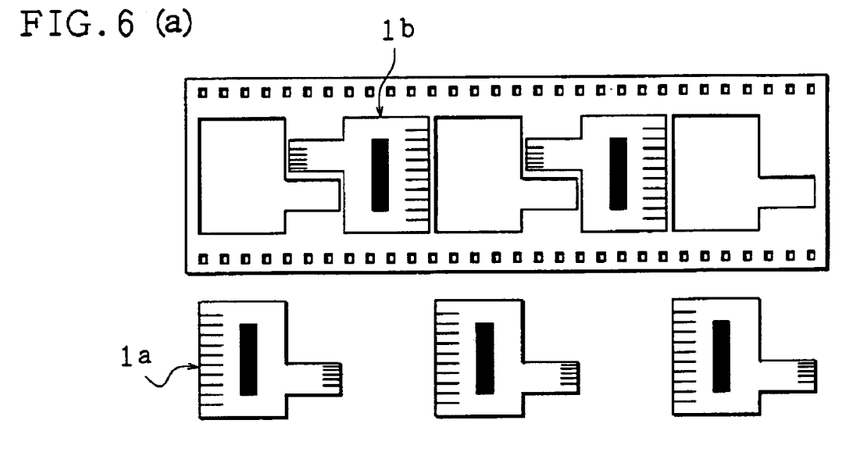
FIGS. 6(a) and 6(b) are views explaining a part of still another manufacturing procedure of the COF.

The ILB step is followed by the resin applying step and electrical testing step. Then, in the following punching step of FIGS. 6(a) and 6(b), as was in the ILB step, two kinds of COFs 1 are punched out from the same tape carrier 4 with two kinds of punching molds by feeding the tape carrier 4 once into two punching devices or feeding the tape carrier 4 into one punching device twice. To be more specific, as shown in FIG. 6(a), the COFs 1a are punched out by the first punching device (or in the first feeding), and as shown in FIG. 6(b), the COFs 1b are punched out by the second punching device (or in the second feeding). Alternatively, a punching mold which can simultaneously punch out two kinds of COFs 1 may be employed in the punching step.
(Embodiment 2)

Figure 7:
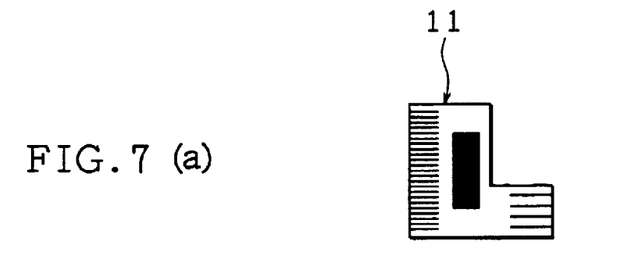
FIG. 7(a) is a plan view showing the shape of a COF to be manufactured.
FIG. 7(b) is a plan view showing the pattern layout of the COFs on a lengthy tape carrier.
FIG. 7(c) is a plan view showing a conventional pattern layout of the COFs on a lengthy tape carrier.

FIGS. 7(a) through 7(c) show another embodiment of the present invention.

A COF 11 of the present embodiment is of the shape shown in FIG. 7(a), and used in the liquid crystal module. In the liquid crystal module, more than one COF is mounted at both ends of the liquid crystal panel, and in such a case, drivers each composed of mirror symmetrical COFs are mounted respectively at the top and bottom (right and left) of the liquid crystal panel. The arrangement of the present embodiment is particularly effective in manufacturing the mirror symmetrical COFs.

According to the arrangement of the present embodiment, as shown in FIG. 7(b), the COFs 11a which are of the same shape as that of the COF 11 of FIG. 7(a) and COFs 11b which are mirror symmetrical with respect to the COFs 11a are aligned alternately on the same tape carrier 4. The COFs 11b are positioned where the COFs 11a are reversed from left to right and turned by 90 degrees counter clockwise in the drawing. The semiconductor elements 12a are bonded to the COFs 11a, and the semiconductor elements 12b are bonded to the COFs 11b. The semiconductor elements 12a and 12b are rotated by 90 degrees to match with the COFs 11a and 11b on the tape carrier 4.

As has been discussed, in the present embodiment, two kinds of COFs 11a and 11b which are mirror symmetrical with respect to each other are aligned on the tape carrier 4 in directions that minimize the useless areas of the tape carrier 4. Accordingly, more COFs can be mounted on the tape carrier 4 along its lengthwise direction, thereby utilizing the tape area efficiently.

Conventionally, the COFs ha and 11b have to be manufactured out of different tape carriers. FIG. 7(c) shows the tape carrier on which the COFs 11a are formed in accordance with the conventional manufacturing method.

According to the arrangement of the present embodiment shown in FIG. 7(b), six COFs 11a and 11b are manufactured in total from the tape carrier 4 with the length shown in the drawing. In contrast, according to the conventional arrangement shown in FIG. 7(c), only five COFs 11a are manufactured from the tape carrier of the same length as that shown in FIG. 7(b). Thus, according to the arrangement of the present embodiment, more COFs can be obtained from the tape carrier of the same length in comparison with the conventional method, and significant savings in manufacturing costs of the COFs can be realized.

Further, when two kinds of COFs are manufactured, only one kind of tape carrier is necessary, because two kinds of COFs can be manufactured simultaneously on the same tape carrier.

In the manufacturing procedure of the COFs 11a and 11b, the semiconductor elements 12a and 12b respectively bonded to the COFs 11a and 11b are not necessarily the same (that is, the semiconductor elements 12a and 12b are generally designed so as to function mirror symmetrically). In this case, the bonding is not conducted by merely providing a mechanism which can rotate the picked-up semiconductor elements 12a and 12b at arbitrary angles as shown in FIG. 4(b) in Embodiment 1.

Thus, in the ILB step of the present embodiment, as were in the steps of FIGS. 5(b) and 5(c) of Embodiment 1, it is preferable to mount the semiconductor elements 12a and 12b alternately on the same tape carrier 4 by using two pick-up mechanisms, or alternatively, by feeding the tape carrier 4 twice into the bonding device comprising the pick-up mechanism and inner lead bonder. The positional relation between the adjacent COFs 11a and 11b in the layout on the tape carrier 4 is constant. That is, when the COFs 11a (COFs 11b) alone are concerned, the alignment direction and intervals on the tape carrier 4 are constant. Hence, it is by no means difficult to mount the semiconductor element 12a onto each COF 11a by using one pick-up mechanism.

The same can be said in the punching step. That is, because the same punching mold can not be used for the mirror symmetrical COFs 11a and 11b, it is preferable to use two kinds of punching molds, and feed the tape carrier 4 into two punching devices once or feed the tape carrier 4 into one punching device twice as in the steps of FIGS. 6(a) and 6(b) in Embodiment 1.

(Embodiment 3)

Figure 8:
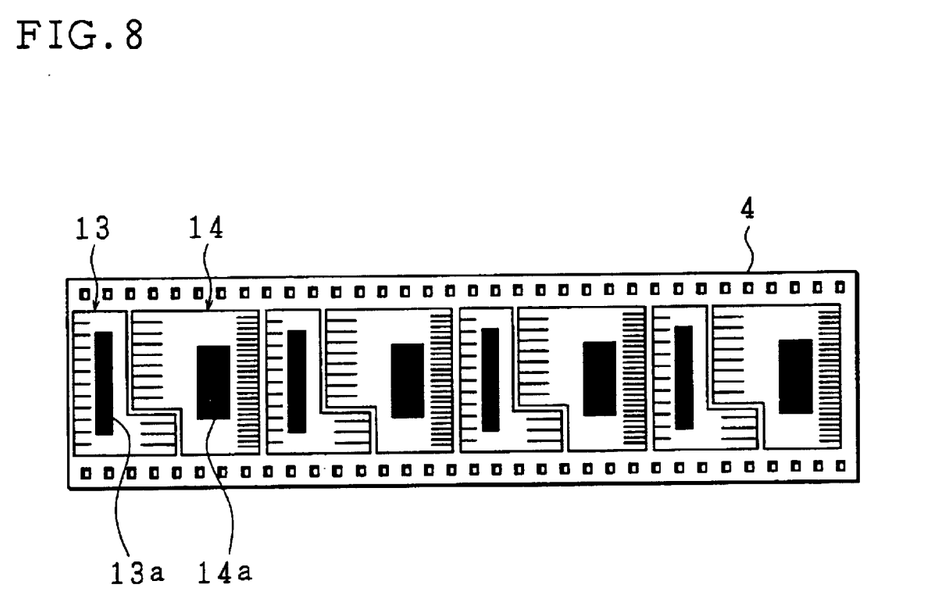
FIG. 8 is a view depicting an arrangement in accordance with Embodiment 3 of the present invention, and shows a plan view illustrating a pattern layout of COFs of more than one kind on a lengthy tape carrier.

FIG. 8 shows still another embodiment of the present invention.

In the present embodiment, two kinds of COFs 13 and 14 of different shapes are aligned alternately on the same tape carrier 4. The COFs 13 and 14 are not necessarily used for the same module, and they can be used for different purposes when punched out. The COFs 13 and 14 are combined in such a manner that the pattern area on the tape carrier 4 can be utilized most efficiently (that is, useless areas which are not used in manufacturing the COFs are minimized).

FIG. 8 shows a case where two kinds of COFs are formed on the same tape carrier 4, but three or more kinds of COFs may be formed on the same tape carrier 4. In such a case, a plurality of kinds of COFs are aligned in a specific order.

As has been discussed, according to the arrangement of the present embodiment, more than one kind of COFs each having a different shape are simultaneously formed on the same tape carrier. By making a combination that minimizes the useless areas on the tape carrier, the tape area can be utilized efficiently, and significant manufacturing cost savings of the COFs can be realized.

Further, because more than one kind of COFs can be formed simultaneously on one kind of tape carrier, this method is suitable in manufacturing many kinds of COFs with a small number of each.

In the manufacturing procedure of the COFs 13 and 14, the semiconductor elements 13a and 14a bonded to the COFs 13 and 14 in the ILB step are basically of different kinds. Thus, as was in Embodiment 2, the bonding is not conducted by merely providing a mechanism which can rotate the picked-up semiconductor elements 13a and 14a at arbitrary angles as shown in FIG. 4(b) in Embodiment 1.

Thus, in the ILB step of the present embodiment, as in the steps of FIGS. 5(b) and 5(c) in Embodiment 1, it is preferable to mount the semiconductor elements 13a and 14a alternately on the same tape carrier 4 by using two pick-up mechanisms, or alternatively, by feeding the tape carrier 4 twice into the bonding device comprising the pick-up mechanism and inner lead bonder. The positional relation between the adjacent COFs 13 and 14 in the layout on the tape carrier 4 is constant. That is, when the COFs 13 (COFs 14) alone are concerned, the alignment direction and intervals on the tape carrier 4 are constant. Hence, it is by no means difficult to mount the semiconductor element 13a onto each COF 13 by using one pick-up mechanism.

Even in the case of forming three or more kinds of COFs on the same tape carrier, the positional relation between two kinds of adjacent COFs of specific kinds is constant. That is, when one specific kind of COFs alone are concerned, the alignment direction and intervals on the tape carrier 4 are constant. In other words, the COFs of the same kind are repetitively formed on the same tape carrier 4 at regular intervals.

The same can be said in the punching step. That is, because the same punching mold can not be used for the COFs 13 and 14 of different shapes, it is preferable to use two kinds of punching molds, and feed the tape carrier 4 once into two punching devices or feed the tape carrier 4 into one punching device twice as were in the steps of FIGS. 6(a) and 6(b) in Embodiment 1.

(Embodiment 4)

In Embodiments 1 through 3, in the ILB step shown in FIG. 2, the semiconductor element 2 and tape carrier 4 are aligned with respect to each other at the protruding electrode 9 of the former and the copper foil pattern 8 of the latter, and bonded to each other by means of heating and pressurizing by the inner lead bonder. Further, after the protruding electrode 9 is connected to the copper foil pattern 8, a space formed between the tape carrier 4 and semiconductor element 2 is filled with the sealing resin 5 to enhance moisture resistance and mechanical strength.

In contrast, in the present embodiment, the ILB step is simplified by using an anisotropic bonding agent to bond the semiconductor element and tape carrier.

Figure 9:
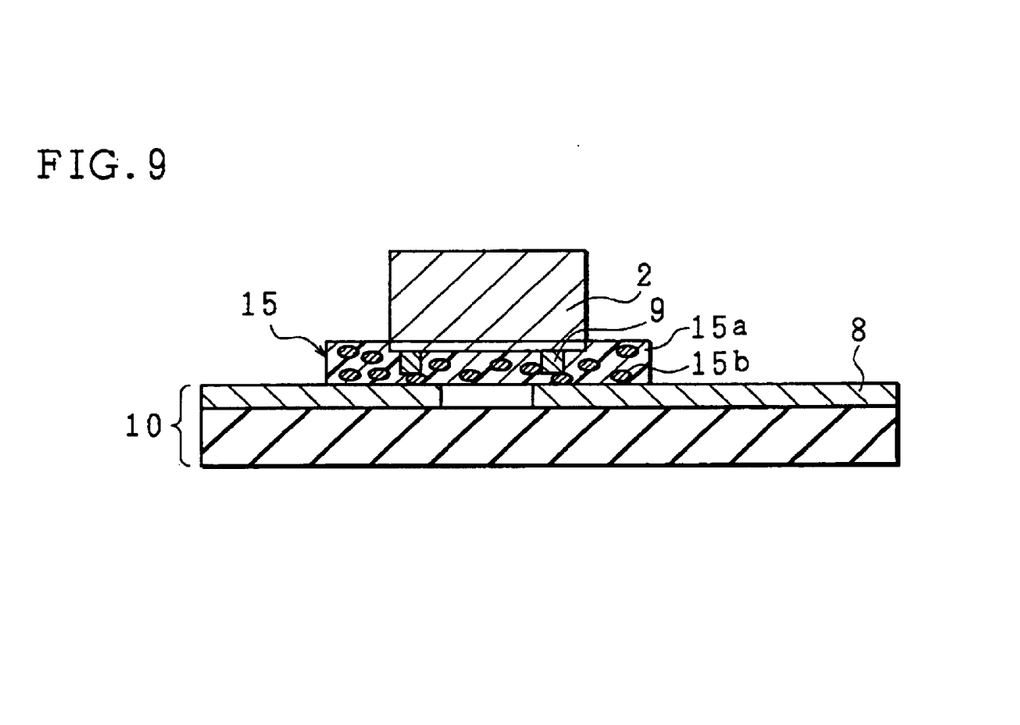
FIG. 9 is a view depicting an arrangement in accordance with Embodiment 4 of the present invention, and shows a cross section depicting an arrangement of a COF when a semiconductor element and a tape carrier are bonded to each other through an anisotropic conductive bonding film.

According to the arrangement shown in FIG. 9, the protruding electrode 9 of the semiconductor element 2 and copper foil pattern 8 of the tape carrier 10 are bonded to each other by an anisotropic conductive bonding film 15 which is made by dispersing conductive particles 15b within an insulating bonding agent 15a. In this case, the anisotropic conductive bonding film 15 is transferred onto the copper foil pattern 8 of the tape carrier 10, and after the semiconductor element 2 is positioned over the same, a pressure is applied, whereby the protruding electrode 9 and copper foil pattern 8 are electrically connected through the conductive particles 15b.

In case that the anisotropic conductive bonding film 15 is used as has been discussed, the end portion can be also sealed by the anisotropic conductive bonding film 15. Thus, no sealing resin is necessary and the step of filling the space with the sealing resin can be omitted, thereby making the assembling step simpler than the conventional method. In other words, in the case of the assembly in which the protruding electrode 9 of the semiconductor element 2 is bonded to the copper foil pattern 8 of the tape carrier 10 through the Au—Sn alloy as described in Embodiment 1, two steps are required: bonding the protruding electrode 9 to the copper foil pattern 8 in the ILB step; and sealing the bonded portion in the resin sealing step. However, if the anisotropic conductive bonding agent is used as was discussed herein, the bonding step corresponding to the ILB step can include the sealing step, thereby making the procedure simpler.

In FIG. 9, the anisotropic conductive bonding film 15 is used as the anisotropic conductive bonding agent. However, the same effect can be obtained if an anisotropic conductive bonding paste 16 is used as shown in FIG. 10.

Figure 10:
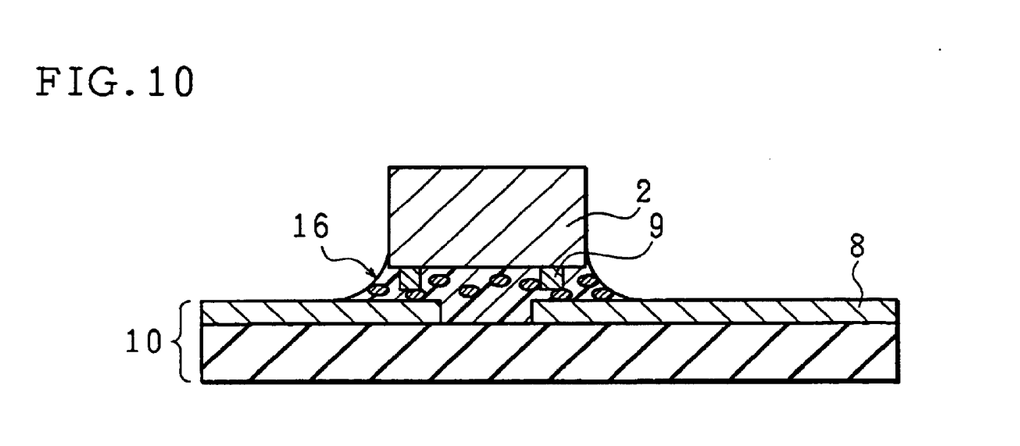
FIG. 10 is a view depicting an arrangement in accordance with Embodiment 4 of the present invention, and shows a cross section depicting an arrangement of a COF when a semiconductor element and a tape carrier are bonded to each other through an anisotropic conductive bonding paste.

Also, FIGS. 9 and 10 show the case where double-layer tape carrier 10 is used. However, the structure of the tape carrier is not especially limited, and the triple-layer tape carrier 4 can be used as well. The same can be said in Embodiments 2 and 3. In other words, in Embodiment 2 or 3, the tape carrier 4 can be replaced with the double-layer tape carrier 10.

As has been discussed, a tape carrier semiconductor device of Embodiment 1 can be manufactured by:

bonding and mounting a semiconductor element on a specific position of each wiring pattern on a tape carrier, on which wiring patterns of an identical shape are aligned in more than one direction with respect to a direction in which the tape carrier is fed, in a layout that increases a utilized area of the tape carrier; and punching out the tape carrier semiconductor devices, each having the wiring pattern and the semiconductor element bonded and mounted thereon, from the tape carrier.

In this manner, by aligning the wiring patterns of the identical shape in more than one direction with respect to a direction in which the tape carrier is fed in a layout that increases a utilized area of the tape carrier, useless areas which have no contribution in forming the tape carrier semiconductor devices on the tape carrier can be reduced as compared with a conventional arrangement in which all the wiring patterns are formed and aligned on the tape carrier along the same direction.

Consequently, from the tape carrier of a specific length, more tape carrier semiconductor devices can be manufactured compared with the conventional method, thereby making it possible to significantly save on the manufacturing costs of the tape carrier semiconductor devices.

Further, a tape carrier type semiconductor device of Embodiments 2 and 3 is manufactured by:

bonding and mounting a semiconductor element on a specific position of each wiring pattern, on a tape carrier on which wiring patterns of more than one kind each having a different shape are aligned, in a layout that increases a utilized area of the tape carrier; and punching out tape carrier semiconductor devices, each having the wiring pattern and the semiconductor element bonded and mounted thereon, from the tape carrier.

In the case where the wiring patterns of more than one kind each having a different shape are aligned on the same tape carrier, these wiring patterns of more than one kind can be aligned in a layout that increases a utilized area of the tape carrier by making an optimal combination. Thus, useless areas which have no contribution in forming the tape carrier semiconductor devices on the tape carrier can be reduced as compared with the conventional arrangement in which the wiring patterns of the different kinds are aligned along the same direction.

Consequently, from the tape carrier of a specific length, more tape carrier semiconductor devices can be manufactured compared with the conventional method, thereby making it possible to significantly save on the manufacturing costs of the tape carrier semiconductor devices.

Further, in the case where the tape carrier semiconductor devices of more than one kind are manufactured, these tape carrier semiconductor devices can be manufactured simultaneously on a single kind of tape carrier. Thus, the arrangements of the present invention are suitable in manufacturing devices of many kinds with a small number of each.

The tape carrier used for the tape carrier semiconductor device may be arranged in such a manner that the wiring patterns are fixed onto a tape carrier material forming a basis of the tape carrier through a bonding agent. In this case, the present invention can be applied to a triple-layer tape carrier.

Alternatively, the tape carrier may be arranged in such a manner that the wiring patterns are fixed onto a tape carrier material forming a basis of the tape carrier without using any bonding agent. In this case, the present invention can be applied to a double-layer tape carrier.

The above method of manufacturing a tape carrier semiconductor device may be arranged in such a manner that each semiconductor element is rotated in accordance with an alignment direction of the wiring pattern, and then mounted on the specific position of the wiring pattern on the tape carrier.

In other words, in the case where the wiring patterns of the same shape are aligned in more than one direction with respect to a direction in which the tape carrier is fed, the semiconductor elements mounted on the wiring patterns have to be mounted in accordance with the alignment direction of the wiring patterns. Hence, according to the above arrangement, the semiconductor elements are rotated in accordance with their respective wiring patterns and then mounted on the specific positions of the wiring patterns, thereby making it possible to mount the semiconductor elements in accordance with the alignment directions of their respective wiring patterns.

Also, the tape carrier semiconductor device formed on the tape carrier may be arranged in such a manner so as to be punched out from the tape carrier by a punching mold which is allowed to rotate in accordance with an alignment direction of the wiring patterns.

In other words, in the case where the wiring patterns of the same shape are aligned in more than one direction with respect to a direction in which the tape carrier is fed, the tape carrier semiconductor devices on the tape carrier have to be punched out in accordance with the alignment direction of the wiring patterns. Hence, according to the above arrangement, the tape carrier semiconductor devices on the tape carrier can be punched out in accordance with the alignment direction of the wiring patterns.

The above manufacturing method of a tape carrier semiconductor device may be arranged in such a manner that:

each semiconductor element is mounted on the specific position of the wiring pattern on the tape carrier by pick-up mechanisms provided in one-to-one correspondence for each kind of wiring patterns on the tape carrier; and the semiconductor elements to be mounted on the wiring patterns of a same kind are mounted by a same pick-up mechanism.

In other words, in the case where the wiring patterns of more than one kind are formed on the tape carrier simultaneously, the semiconductor elements have to be mounted on their respective wiring patterns in accordance with the kinds thereof. Hence, according to the above arrangement, the semiconductor elements can be mounted on their respective wiring patterns in accordance with the kinds thereof. Here, even when the wiring patterns are of the same shape, if the alignment directions are different, these wiring patterns are deemed as different kinds.

The manufacturing method of a tape carrier semiconductor device may be arranged in such a manner that each semiconductor element is mounted on the specific position of the wiring pattern on the tape carrier while the tape carrier is fed into a manufacturing device which conducts the bonding and mounting step as many times as the number of kinds of the wiring patterns on the tape carrier, and that the semiconductor elements to be mounted on the wiring patterns of a same kind are mounted in a same round of repetitive feeding of the tape carrier.

According to the above arrangement, the semiconductor elements can be mounted in accordance with the kinds of the wiring patterns.

The manufacturing method of the tape carrier semiconductor device may be arranged in such a manner that:

tape carrier semiconductor devices on the tape carrier are punched out from the tape carrier by as many punching molds as the number of kinds of the wiring patterns; and the tape carrier semiconductor devices having the wiring patterns of a same kind are punched out by a same punching mold.

In other words, in the case where more than one kind of wiring pattern is formed simultaneously on the tape carrier, the tape carrier semiconductor devices have to be punched out from the tape carrier in accordance with the kinds (shapes) of the wiring patterns. Hence, according to the above arrangement, the tape carrier semiconductor devices can be punched out from the tape carrier in accordance with the kinds of the wiring patterns.

In addition, the manufacturing method of a tape carrier semiconductor device may be arranged in such a manner that:

the tape carrier semiconductor devices on the tape carrier are punched out from the tape carrier by as many punching molds as the number of kinds of the wiring patterns while being fed into a device conducting the punching step as many times as the number of kinds of the wiring pattern; and the tape carrier semiconductor devices having the wiring patterns of a same kind are punched out by a same punching mold.

According to the above arrangement, the tape carrier semiconductor devices can be punched out from the wiring pattern in accordance with the kinds of the wiring patterns.

The manufacturing method of a tape carrier semiconductor device may be arranged in such a manner that the semiconductor element is bonded to the wiring pattern on the tape carrier by forming a Au—Sn alloy.

According to the above arrangement, for example, the gilt semiconductor electrode and the tinned wiring pattern are heated and pressurized and the Au—Sn alloy is formed, whereby the semiconductor element and wiring pattern are bonded to each other. Thus, the conventional bonding method can be employed.

The manufacturing method of a tape carrier semiconductor device may be arranged in such a manner that the semiconductor element is bonded to the wiring pattern on the tape carrier by means of an anisotropic conductive bonding agent.

According to the above arrangement, by bonding the semiconductor element and wiring pattern on the tape carrier by means of an anisotropic conductive bonding agent, the end portion can be sealed by the anisotropic conductive bonding agent. Thus, the sealing resin which is conventionally used to obtain the above sealing effect can be omitted.

Thus, because the sealing resin filling step can be omitted, the procedure can be simpler than the conventional procedure.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed:

1. A tape carrier used for a tape carrier type semiconductor device comprising a lengthy tape carrier and a semiconductor element bonded and mounted thereon, on which wiring patterns of said tape carrier type semiconductor device are successively formed, wherein:

each of said wiring patterns is formed in a combination shape of (i) a base section, having mounted thereon a semiconductor element, and (ii) at least one protruding section, that protrudes from said base section, having some external connection terminals; and two or more adjacently positioned wiring patterns of said plurality of wiring patterns form a set, and said wiring patterns in each set are arranged such that protruding sections of the wiring patterns are positioned adjacent to each other in a way to reduce an overall useless area of the tape carrier.

2. The tape carrier of claim 1, wherein said wiring patterns are fixed onto a tape carder material of said tape carrier through a bonding agent.

3. The tape carrier of claim 1, wherein said wiring patterns are fixed onto a tape carrier material of said tape carrier without using any bonding agent.

4. The tape carrier of claim 1, wherein said tape carrier type semiconductor devices are "L" shaped.

5. The tape carrier of claim 1, wherein said tape carrier type semiconductor devices are "T" shaped.

6. The tape carrier of claim 1, wherein said tape carrier type semiconductor devices are triangular-shaped.

7. The tape carrier as set forth in claim 1, wherein:

said base section has a plurality of first external connection terminals, and said protruding section has a plurality of second external connection terminals, and a number of said second external connection terminals is smaller than a number of said first external connection terminals.

8. The tape carrier as set forth in claim 1, wherein:

said plurality of wiring patterns of said set have the same shape.

9. The tape carrier as set forth in claim 1, wherein:

said plurality of wiring patterns of said set have different shapes.

10. The tape carrier as set forth in claim 1, wherein:

each of said plurality of set areas is substantially rectangular in shape, and said plurality of set areas are successively formed in a direction of feeding of said tape carrier.

11. The tape carrier as set forth in claim 1, wherein:

adjacent wiring patterns in said set are arranged in the direction of feeding of said tape carrier.

* * * * *